July 15, 1952 — E. A. NEWMAN — 2,603,750
ELECTRICAL CIRCUIT ARRANGEMENT FOR
THE GENERATION OF OSCILLATIONS
Filed Feb. 14, 1948
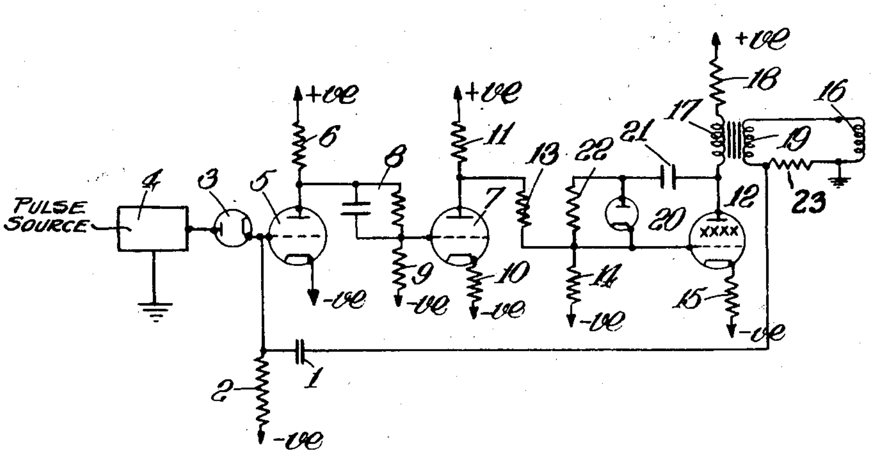
Inventor:
Edward Arthur Newman
By J. O. Ollier
Attorney Patented July 15, 1952 2,603,750

UNITED STATES PATENT OFFICE 2,603,750

ELECTRICAL CIRCUIT ARRANGEMENT FOR THE GENERATION OF OSCILLATIONS

Edward Arthur Newman, Ealing, London, England, assignor to Electric & Musical Industries Limited, Hayes, England, a company of Great Britain Application February 14, 1948, Serial No. 8,453
In Great Britain February 28, 1947

9 Claims. (Cl. 250—36)

This invention relates to circuit arrangements for generating electrical sawtooth oscillations, and more particularly but not exclusively to circuits for generating sawtooth current variations in the magnetic deflection coils of a cathode ray tube.

The object of the present invention is to provide a circuit in which the rapid return portions of the sawtooth oscillations are generated in an improved or more rapid manner.

According to one feature of the invention there is provided a circuit arrangement for generating electrical sawtooth oscillations comprising an amplifier in which during the slowly varying forward portions of said sawtooth oscillations the gain of said amplifier is reduced whilst during the rapid return portions of said sawtooth oscillations the gain of said amplifier is increased so that the rapidity of the return portions is increased compared with what it would be if the gain of said amplifier were not increased.

According to another feature of the invention there is provided a circuit arrangement for generating electrical sawtooth oscillations which have slowly varying forward portions and rapid return portions comprising an amplifier arranged to amplifiy the slowly varying portions of said oscillations and means for rendering said amplifier unstable at predetermined periods so that the return portions of the sawtooth oscillations are generated by virtue of a natural oscillation of said amplifier.

According to another feature of the invention there is provided a circuit arrangement for generating electrical sawtooth oscillations which have slowly varying forward portions and rapid return portions comprising an amplifier, a negative feedback path between an output circuit of said amplifier and an input circuit thereof which is operative during the slowly varying portions of said sawtooth oscillations and means for rendering said negative feedback path substantially ineffective during the rapid return portions of said sawtooth oscillations.

In order that the invention may be more clearly understood and readily carried into effect, it will now be described with reference to the accompanying drawing which illustrates one embodiment of a circuit according to the invention.

Referring to the drawing, which shows a circuit arrangement for feeding the magnetic deflection coils of a cathode ray tube with sawtooth current variations, a condenser 1 is connected through a charging resistor 2 to a source of negative charging potential so that a negative charge builds up on the condenser and generates a substantially linear forward portion of a sawtooth oscillation. The condenser 1 is discharged periodically by a diode 3 which is rendered periodically conducting by controlling impulses from a source 4 so that sawtooth oscillations of potential are set up at the junction between condenser 1 and resistor 2.

The sawtooth oscillations are applied to the control electrode of an amplifier valve 5 the amplified output from which, set up across the load resistor 6, is applied to the control electrode of a further amplifier valve 7 through a D. C. coupling network 8. The control electrode of valve 7 is biased via resistor 9 and a cathode resistor 10 is provided for linearizing the characteristic of said valve. The amplified output from valve 7 set up across its load resistor 11 is applied to the control electrode of an amplifier valve 12 via coupling resistor 13. The control electrode of valve 12 is biased through resistor 14 and a cathode resistor 15 is provided for linearizing the characteristic of said valve. This amplifier valve 12 feeds deflecting coils 16 through a transformer having a primary winding 17 and a secondary winding 19 and the control applied to said control electrode of valve 12 is in such sense that said electrode is lowered in potential during the forward portions of the sawtooth oscillations. In series with the primary winding 17 is a small resistor 18 from which negative current feedback may be derived and applied to the control electrode of valve 7. A diode 20 is connected between the anode and control electrode of the valve 12 in the manner shown, so that it becomes conducting when the control electrode of valve 12 falls in potential. The anode of the diode 20 is connected to the anode of the valve 12 via a condenser 21, a leak resistor 22 also being provided as shown. Thus, during the forward portions of the sawtooth oscillations, the amplifier valve 12 has a large portion of its output applied to its input in a degenerative sense so that its gain is small. Anode current of the valve 12, flowing in the primary winding 17 of said transformer, induces an electromotive force in the secondary winding 19 which in turn causes a sawtooth current to flow in coils 16. Included in the path of the current through the coils 16 is a series resistor 23 across which is developed a voltage proportional to the output current, and this voltage is applied in a degenerative sense to the charging condenser 1 in order to make more nearly linear the forward portion of the sawtooth oscillation.

When the forward portion of a sawtooth oscillation ends owing to the arrival of a controlling impulse at the anode of discharge diode 3 the potential of the control electrode of amplifier valve 12 is raised, thus causing the diode 20 to become non-conducting. Consequently substantially no degenerative circuit exists directly between the input and output electrodes of the valve 12, and the gain of said valve rises accordingly. Owing consequently to the high amplification of the circuit comprising amplifier valves 5, 7 and 12 and to the presence of the feedback path through the condenser 1, the circuit becomes unstable and the rapid return portions of the sawtooth voltage are thus set up as regenerative half-cycles of oscillation at the natural frequency of the circuit. At the end of a half-cycle of natural oscillation the diode 20 becomes conducting and renders the circuit stable and so prevents the persistence of the regenerative oscillations. The circuit accordingly then commences to generate the forward stroke of another sawtooth oscillation.

I claim:

1. A circuit arrangement for generating electrical sawtooth oscillations, comprising a variable gain amplifier, means for controlling said amplifier to amplify the slowly varying forward portions of said sawtooth oscillations, a unidirectionally conducting device connected to said amplifier, and means for varying the conductivity of said device for increasing the gain of said amplifier during the rapid return portions of said sawtooth oscillations to increase the rapidity of the return portions.

2. A circuit arrangement for generating electrical sawtooth oscillations, comprising an amplifier having a stable and an unstable condition, means for controlling said amplifier to amplify the slowly varying forward portions of said sawtooth oscillations whilst said amplifier is in a stable condition, and means for rendering said amplifier unstable at predetermined periods to produce natural oscillations and consequent generation of the return portions of the sawtooth oscillations.

3. A circuit arrangement for generating electrical sawtooth oscillations, comprising an amplifier, a negative feedback path between an output circuit of said amplifier and an input circuit thereof, means for controlling said amplifier to amplify the slowly varying forward portions of said sawtooth oscillations whilst said negative feedback path is operative, and means for rendering said negative feedback path substantially ineffective to increase the gain of said amplifier during the rapid return portions of said sawtooth oscillations.

4. A circuit arrangement for generating electrical sawtooth oscillations, comprising a variable gain amplifier, a storage device, means for charging said storage device to generate the slowly varying portions of said sawtooth oscillations, means for periodically discharging said storage device, means for feeding the output of said storage device to said amplifier to cause said amplifier to amplify the slowly varying forward portions of said sawtooth oscillations, a unidirectionally conducting device connected to said amplifier, means for maintaining said unidirectionally conducting device in a condition to maintain the gain of said amplifier low during said slowly varying portions, and means for changing the condition of said unidirectionally conducting device when said storage device is discharged to increase the gain of said amplifier during the rapid return portions of said sawtooth oscillations.

5. A circuit arrangement for generating electrical sawtooth oscillations, comprising an amplifier having a stable and an unstable condition, means for feeding to said amplifier slowly varying forward portions of said oscillations whilst said amplifier is in a stable condition, a unidirectionally conducting device connected to said amplifier for controlling said stable and unstable conditions of said amplifier, and means for controlling said unidirectionally conducting device to change the condition of said amplifier from the stable to the unstable condition at predetermined periods to cause said amplifier to produce natural oscillations and consequent generation of the return portions of the sawtooth oscillations.

6. A circuit arrangement for generating electrical sawtooth oscillations, comprising an amplifier, a negative feedback path between an output circuit of said amplifier and an input circuit thereof, a unidirectionally conducting device connected to said amplifier for switching said negative feedback path in to and out of operation, means for controlling said amplifier to amplify the slowly varying forward portions of said sawtooth oscillations whilst said unidirectionally conducting device is in a condition to make said negative feedback path operative, and means for switching said unidirectionally conducting device to cause said negative feedback path to be rendered inoperative to increase the gain of said amplifier during the rapid return portions of said sawtooth oscillations.

7. A circuit arrangement for generating electrical sawtooth oscillations, comprising an amplifier having a stable and an unstable condition, a storage device, means for charging said storage device to generate the slowly varying portions of said sawtooth oscillations, means for discharging said storage device at predetermined periods, a unidirectionally conducting device connected to said amplifier for controlling said stable and unstable conditions, means for feeding the output of said storage device to said amplifier to amplify the slowly varying forward portions of said oscillations whilst said amplifier is in a stable condition, and means for controlling said unidirectionally conducting device to change said amplifier from the stable to the unstable condition when said storage device is discharged to produce natural oscillations and consequent generation of the return portions of the sawtooth oscillations.

8. A circuit arrangement according to claim 7, including a negative feedback path between an output circuit of said amplifier and an input circuit thereof, said unidirectionally conducting device being connected to said feedback path to render said feedback path effective or ineffective to produce said stable and unstable conditions.

9. A circuit arrangement according to claim 7, including a negative feedback path with a condenser and a resistor in series between said output circuit and said input circuit, said unidirectionally conducting device being connected across said resistor.

EDWARD ARTHUR NEWMAN.

REFERENCES CITED

The following references are of record in the file of this patent:

UNITED STATES PATENTS

| Number | Name | Date |
|---|---|---|
| 2,241,762 | Blumlein | May 13, 1941 |
| 2,251,851 | Moore | Aug. 5, 1941 |
| 2,265,290 | Knick | Dec. 9, 1941 |
| 2,284,378 | Dome | May 26, 1942 |
| 2,296,727 | Moore | Sept. 22, 1942 |
| 2,309,672 | Schade | Feb. 2, 1943 |